(12) United States Patent
Kang

(10) Patent No.: US 7,019,417 B2
(45) Date of Patent: Mar. 28, 2006

(54) POWER-ON RESET CIRCUIT WITH CURRENT DETECTION

(75) Inventor: Hee-Bok Kang, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 453 days.

(21) Appl. No.: 10/330,027

(22) Filed: Dec. 27, 2002

(65) Prior Publication Data
US 2004/0012267 A1    Jan. 22, 2004

(30) Foreign Application Priority Data
Jul. 22, 2002    (KR) .................. 10-2002-0042949

(51) Int. Cl.
*H01L 29/10*    (2006.01)
(52) U.S. Cl. ............... 307/113; 307/125; 307/130; 327/143; 327/198
(58) Field of Classification Search ............ 307/112, 307/140, 132 R, 143, 198; 361/93.4
See application file for complete search history.

(56) References Cited

U.S. PATENT DOCUMENTS

| | | | |
|---|---|---|---|
| 5,396,115 A * | 3/1995 | Coffman et al. ............ 327/143 |
| 5,483,187 A * | 1/1996 | Jang ............................. 327/143 |
| 5,517,144 A * | 5/1996 | Nakashima ................. 327/198 |
| 6,122,191 A | 9/2000 | Hirose et al. |
| 6,363,011 B1 | 3/2002 | Hirose et al. |
| 6,370,075 B1 | 4/2002 | Haeberli et al. |
| 6,469,552 B1 * | 10/2002 | Ohbayashi et al. ......... 327/143 |

\* cited by examiner

*Primary Examiner*—Lynn Feild
*Assistant Examiner*—Michael Rutland-Wallis
(74) *Attorney, Agent, or Firm*—Mayer, Brown, Rowe & Maw LLP

(57) ABSTRACT

There is provided a power-on reset circuit for generating a power-on reset signal regardless of a power-up slope using not an RC delay method but a current detection method. The power-on reset circuit includes: a power supply voltage sensing node; a power supply voltage detecting unit connected to the power supply voltage sensing node, for detecting a power supply voltage level caused by a difference between a pull-up current and a pull-down current, wherein the power supply voltage detecting unit pulls down the power supply voltage sensing node if the power supply voltage reaches a threshold voltage; and a driving unit connected to the power supply voltage sensing node, for pulling up the sensing node if the power supply voltage is lower than the threshold voltage and buffering a signal of the power supply voltage sensing node to output a power-on reset signal.

31 Claims, 7 Drawing Sheets

POWER-ON RESET CIRCUIT WITH CURRENT DETECTION

FIELD OF THE INVENTION

The present invention relates to a semiconductor integrated circuit such as a logic or memory circuit and, more particularly, to a power-on reset circuit.

DESCRIPTION OF THE PRIOR ART

As is well known, a power-on reset circuit is a circuit for resetting function circuits of a semiconductor integrated circuit to an initial state when a power voltage is applied to the semiconductor integrated circuit. Generally, the power-on reset circuit is integrated within the semiconductor integrated circuit.

Chips with a built-in power-on reset circuit are driven by a power supply voltage applied thereto from a system using the chips.

At this time, a conventional power-on reset circuit has a smooth power-up slope due to various technology changes such as complication, variety and a low-power consumption of a system. Therefore, the power-on reset circuit does not correctly generate a desired waveform.

Accordingly, the case that an internal circuit does not accurately perform a reset operation may occur.

FIG. 1 is a circuit diagram of a conventional power-on reset circuit.

Referring to FIG. 1, the conventional power-on reset circuit includes a capacitor 11 for adjusting an RC delay and a pull-up current source 12 for providing a pull-up current. The conventional power-on reset circuit determines a voltage level of a node N1 by an RC delay time between the pull-up current source 12 and the capacitor 11.

Specifically, the conventional power-on reset circuit includes: a PMOS transistor 12 acting as a pull-up current source and having a gate connected to a ground (VSS) terminal and a source/drain connected between a power supply voltage (VCC) terminal and the node N1; an NMOS transistor 11 acting as a capacitor and having a gate connected to the node N1 and a source/drain commonly connected to the ground terminal; an inverter 13 having an input terminal connected to the node N1; an inverter 14 having an output terminal connected to the node N2; a PMOS transistor 15 having a gate connected to an output terminal of the inverter 14 and a source/drain connected between the power supply voltage terminal and a node N2; and an inverter 16 having an input terminal connected to the output terminal of the inverter 14.

After applying the power supply voltage VCC, with an increase of the power supply voltage at an initial stage, the voltage of the node N1 is also increased according to an RC time constant.

Further, with a voltage increase of the node N1, the voltage of the node N2 (i.e., the output of the inverter 13) is increased at an initial stage like a waveform such as the power supply voltage VCC. Then, if the voltage of the node N1 reaches a threshold voltage of the inverter 13, the voltage of the node N2 falls down to the ground voltage.

Consequently, with an increase of the power supply voltage, the power-on reset signal RESET is increased at an initial stage like the power supply voltage and then falls down to the ground voltage at a specific time, thereby being activated.

However, in the conventional power-on reset circuit, a time when the reset signal RESET is activated according to the power-up slope of the power supply voltage is changed. For this reason, it is impossible to secure an operation margin of the semiconductor device operating with a constant specification.

FIGS. 2A and 2B are timing diagrams of the conventional power-on reset circuit. FIG. 2A is the timing diagram of the conventional power-on reset circuit shown in FIG. 1 in case where a power-up slope is relatively fast, FIG. 2B is the timing diagram of the conventional power-on reset circuit shown in FIG. 1 in case where a power-up slope is relatively slow.

Since the case of FIG. 2B can precharge the capacitor for a longer time than the case of FIG. 2A, a sensing level of the capacitor is fast increased so that the power-on reset signal RESET is activated at a relatively low power supply.

In other words, in case of FIG. 2A, the reset signal RESET is activated a time T2. Meanwhile, in case of FIG. 2B, the power-on reset signal RESET is activated at a time T1.

A ferroelectric random access memory (FeRAM) chip needs to again setup a state stored in a FeRAM code register when the power supply voltage is initially applied. At this time, in this read operation, the power-on reset signal RESET is used.

Meanwhile, like the case of FIG. 2B, if the power-on reset signal RESET is activated before the power supply voltage is fully increased, the FeRAM code register is operated at a low power supply voltage. Therefore, data stored in the FeRAM code register is incorrectly read or restored to an insufficient state so that a FeRAM code register failure occurs.

Therefore, there is increasingly demanded a power-on reset circuit capable of constantly generating the power-on reset signal RESET at any power-up slope.

SUMMARY OF THE INVENTION

It is, therefore, an object of the present invention to provide a power-on reset circuit operating regardless of a power-up slope.

Another object of the present invention is to provide a power-on reset circuit operating regardless of RC delay time using not an RC delay method but a current detection method.

Further another object of the present invention is to provide a power-on reset circuit generating a stable power-on reset signal without any glitch.

In an aspect of the present invention, a power-on reset circuit comprises: a power supply voltage sensing node; a power supply voltage detecting means connected to the power supply voltage sensing node, for detecting a power supply voltage level caused by a difference between a pull-up current and a pull-down current, wherein the power supply voltage detecting means pulls down the power supply voltage sensing node if the power supply voltage reaches a threshold voltage; and a driving means connected to the power supply voltage sensing node, for pulling up the sensing node if the power supply voltage is lower than the threshold voltage and buffering a signal of the power supply voltage sensing node to output a power-on reset signal.

In another aspect of the present invention, a power-on reset circuit comprises: a power supply voltage sensing node; a power supply voltage detecting means connected to the power supply voltage sensing node, for detecting a power supply voltage level caused by a difference between a pull-up current and a pull-down current, wherein the power supply voltage detecting means pulls down the power supply voltage sensing node if the power supply voltage reaches a threshold voltage; a driving means connected to the power supply voltage sensing node, for pulling up the sensing node if the power supply voltage is lower than the threshold voltage and buffering a signal of the power supply voltage sensing node to output a power-on reset signal; and a sensing-node voltage level stabilizing means connected to the sensing node, for latching the voltage level of the sensing node to thereby stabilize the voltage level thereof.

Preferably, the power supply voltage detecting means includes: a current detection unit for detecting the power supply voltage level caused by the difference between the pull-up current and the pull-down current, a voltage level of the power supply voltage sensing node feeding back to the current detection unit; and a current sink means connected to the current detection unit, for sinking a current of the power supply voltage sensing node if the power supply voltage reaches the threshold voltage.

Preferably, the current detection unit includes: a pull-up device connected between a power supply terminal and a node (NPOR_3), for pulling up the node (NPOR_3); and a pull-down device for pulling down the node (NPOR_3) in response to the voltage level of the sensing node.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, preferred embodiments of the present invention will be described in detail with reference to attached drawings.

Figure 1:
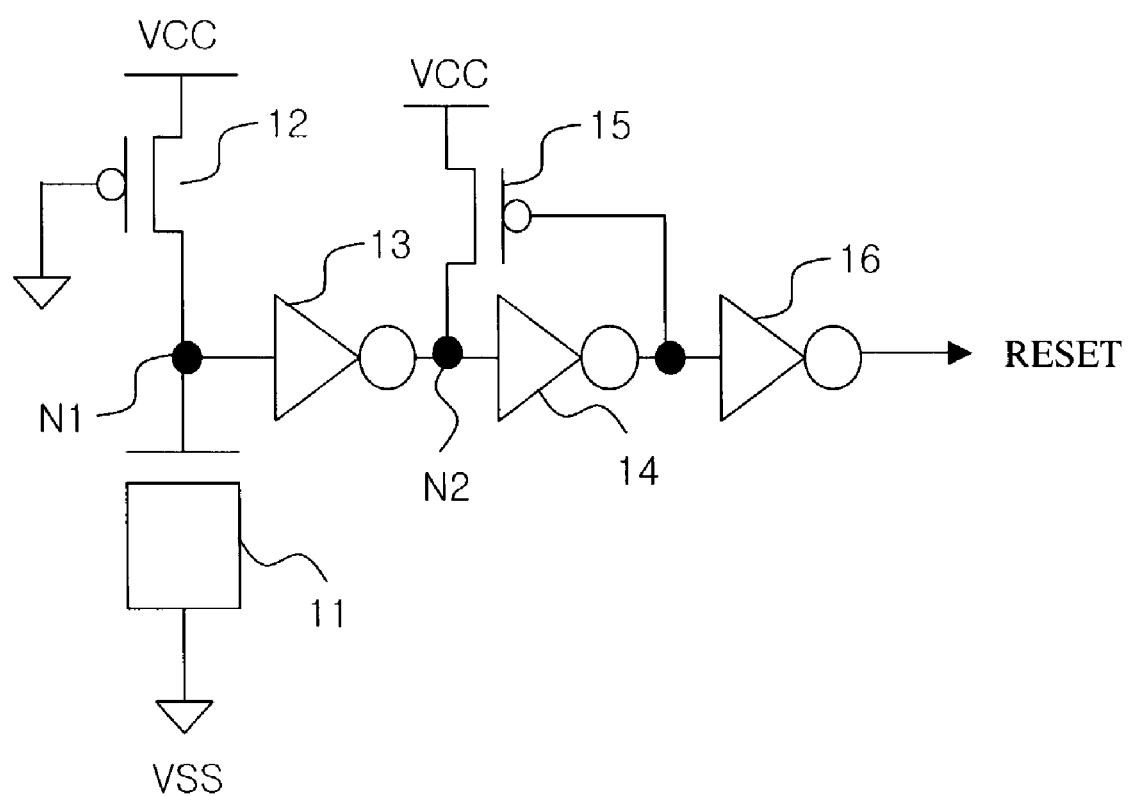
FIG. 1 is a circuit diagram of a conventional power-on reset circuit.
Figure 2A:
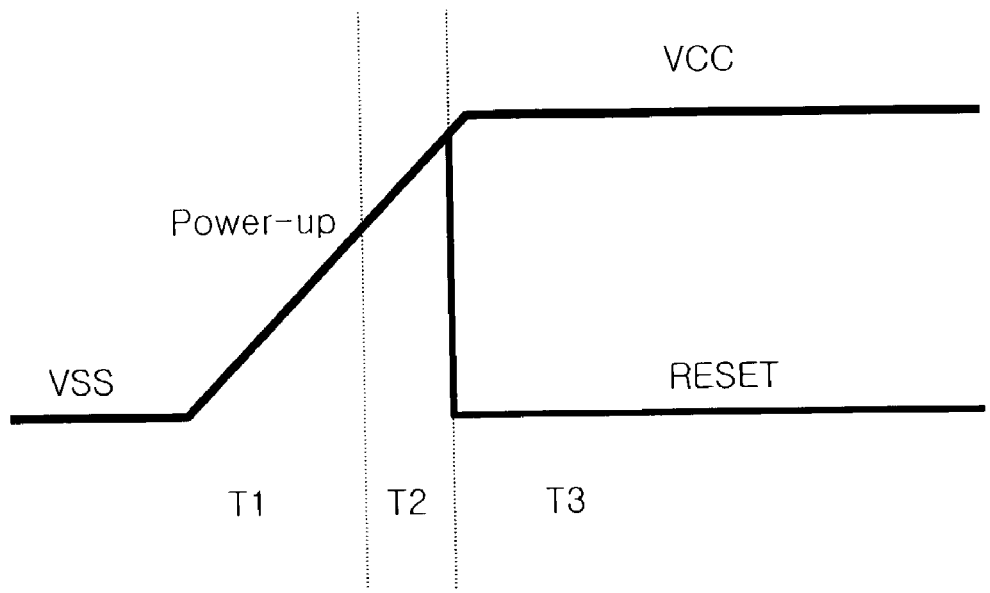
FIG. 2A is a timing diagram of the conventional power-on reset circuit shown in FIG. 1 in case where a power-up slope is relatively fast.
Figure 2B:
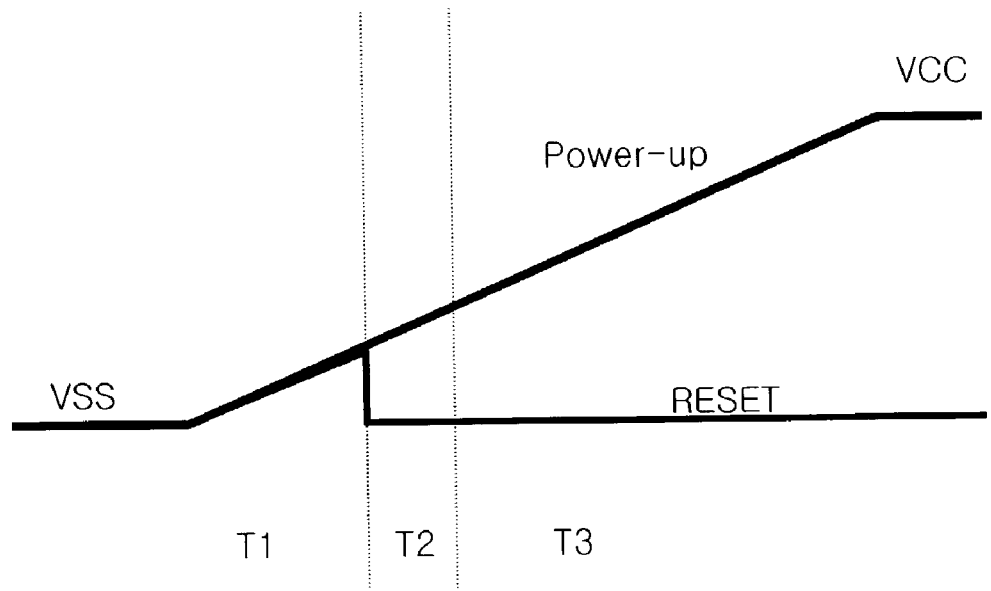
FIG. 2B is a timing diagram of the conventional power-on reset circuit shown in FIG. 1 in case where a power-up slope is relatively slow.
Figure 3:
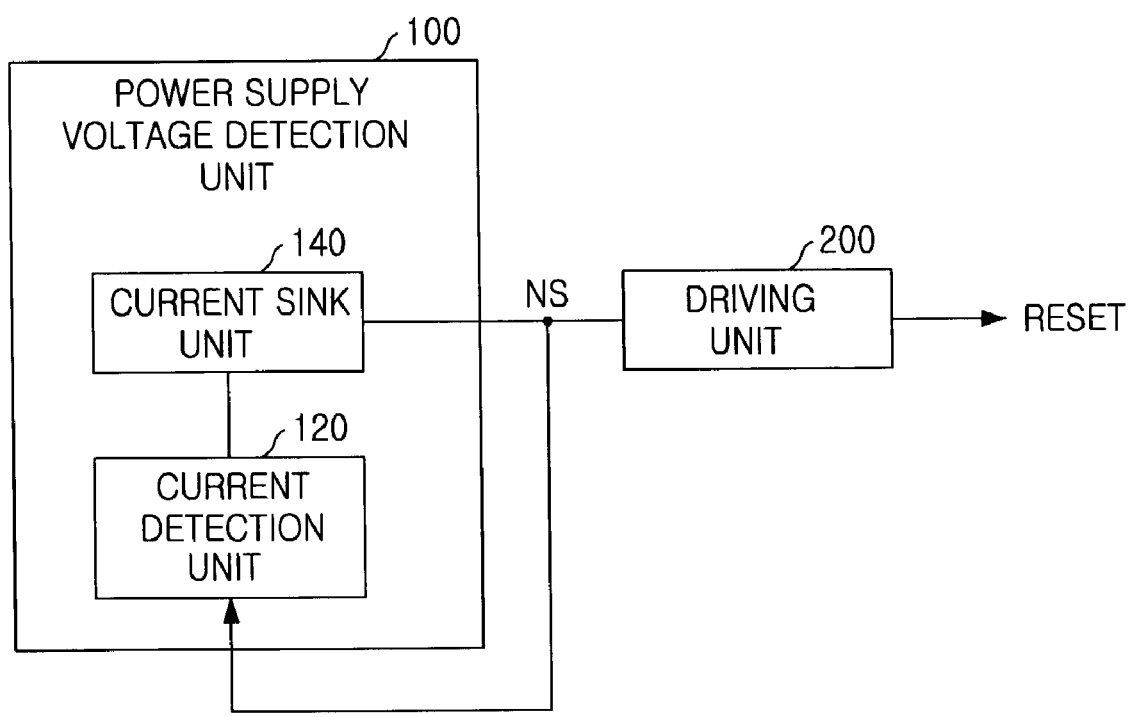
FIGS. 3 and 4 are block diagrams conceptually illustrating a power-on reset circuit in accordance with the present invention.

FIG. 3 is a block diagram conceptually illustrating a power-on reset circuit in accordance with the present invention.

Referring to FIG. 3, the power-on reset circuit in accordance with the present invention includes a power supply voltage detection unit 100 and a driving unit 200, which are connected to each other via a sensing node NS.

The power supply voltage detecting unit 100 includes: a current detection unit 120 for detecting the power supply voltage level caused by the difference between the pull-up current and the pull-down current, in which a voltage level of the sensing node NS feeds back to the current detection unit 120; and a current sink unit 140 connected to the current detection unit 120, for sinking a current of the sensing node NS if the power supply voltage reaches a predetermined threshold voltage (here, the threshold voltage is a power supply voltage level when the power-on reset signal is activated).

In other words, the power supply voltage detection unit 100 detects a power supply voltage level caused by a difference between a pull-up current and a pull-down current. If the power supply voltage level reaches a threshold voltage, the power supply voltage detection unit 100 pulls down the sensing node NS to a logic low state.

The driving unit 200 is connected to the sensing node NS, pulls up the sensing node NS below the threshold voltage. Then, the driving unit 200 buffers a signal of the sensing node NS and outputs a power-on reset signal RESET.

In the power-on reset circuit configured as above in accordance with the present invention, the power supply voltage detection unit 100 determines the threshold voltage by not an RC delay method but a current detection method. Therefore, it is possible to activate the power-on reset signal RESET at a constant threshold voltage regardless of a power-up slope.

Figure 4:
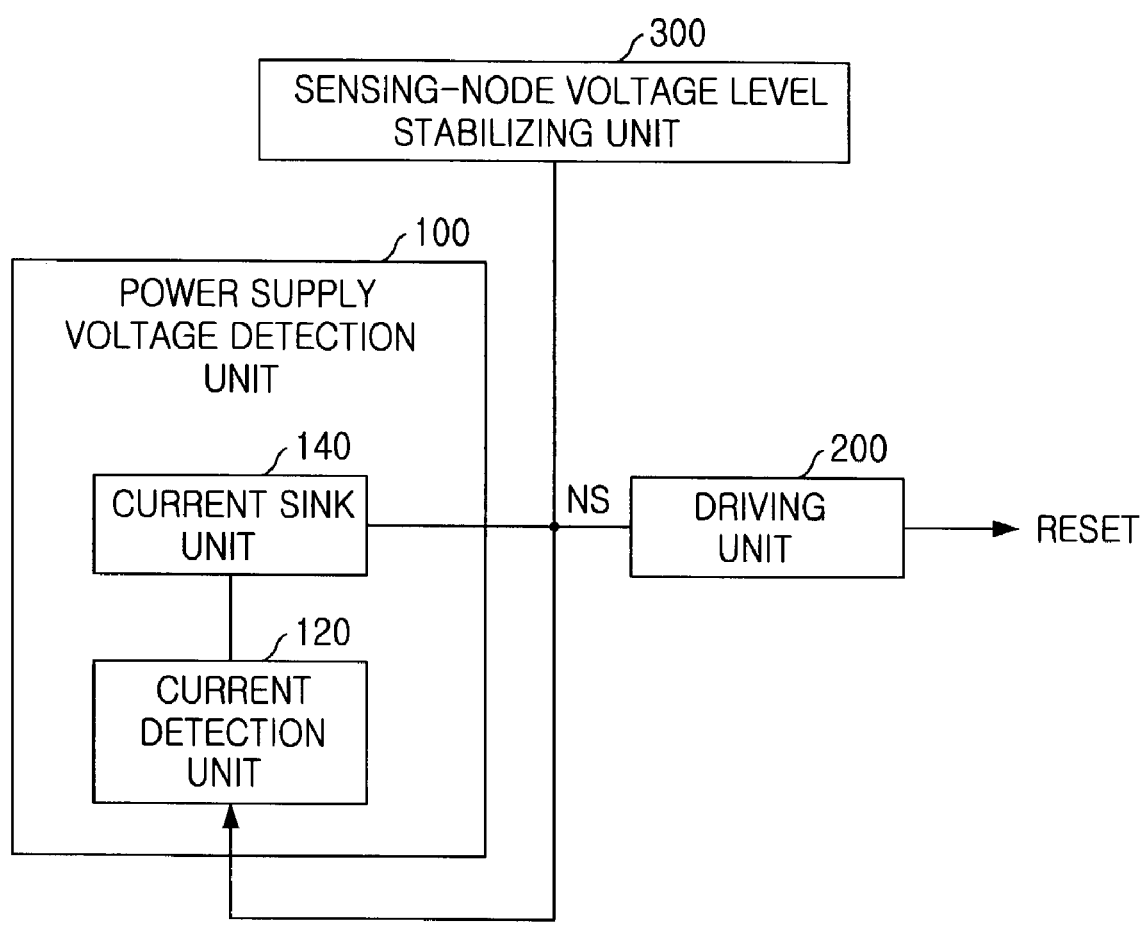

FIG. 4 is a block diagrams conceptually illustrating a power-on reset circuit in accordance with another embodiment of the present invention.

Referring to FIG. 4, the power-on reset circuit in accordance with another embodiment of the present invention includes a power supply voltage detection unit 100, a driving unit 200 and a sensing-node voltage level stabilizing unit 300, which are connected to each other via a sensing node NS.

The power supply voltage detecting unit 100 includes: a current detection unit 120 for detecting the power supply voltage level caused by the difference between the pull-up current and the pull-down current, in which a voltage level of the sensing node NS feeds back to the current detection unit 120; and a current sink unit 140 connected to the current detection unit 120, for sinking a current of the sensing node NS if the power supply voltage reaches a predetermined threshold voltage.

The driving unit 200 is connected to the sensing node NS, pulls up the sensing node NS below the threshold voltage. Then, the driving unit 200 buffers a signal of the sensing node NS and outputs a power-on reset signal RESET.

The sensing-node voltage level stabilizing unit 300 is connected to the sensing node NS and latches the voltage level of the sensing node NS, thereby stabilizing the voltage level of the sensing node NS.

In the power-on reset circuit configured as above in accordance with another embodiment of the present invention, the power-on reset signal RESET is activated at a constant threshold voltage regardless of a power-up slope. Further, since the power-on reset signal RESET is automatically reset to a latch state by the sensing-node voltage level stabilizing unit 300, it is possible to generating the power-on reset signal without any glitch near the active state (the logic "0")

Figure 5:
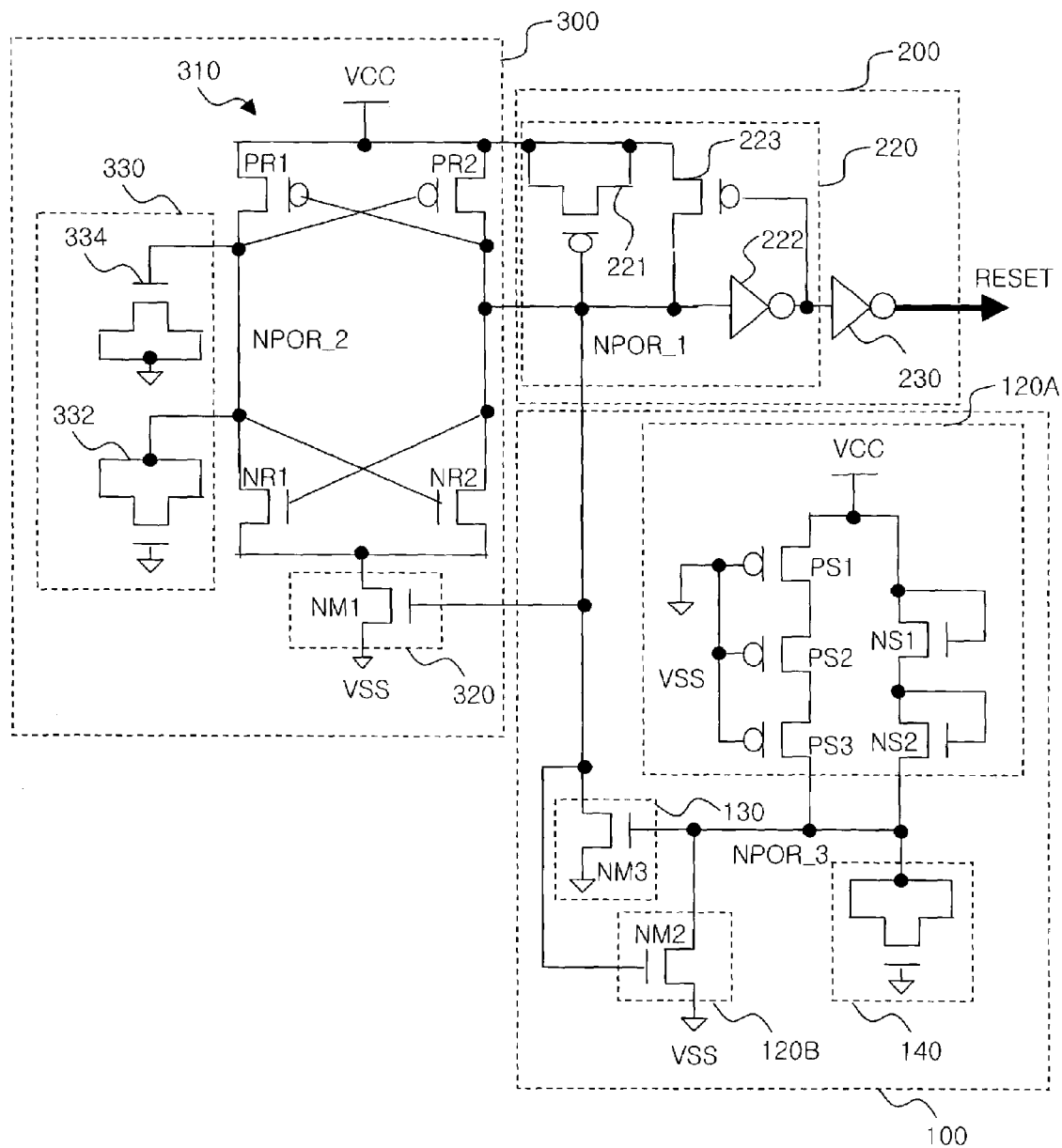
FIG. 5 is a circuit diagram of the power-on reset circuit in accordance with a first embodiment of the present invention.

FIG. 5 is a circuit diagram of a power-on reset circuit in accordance with the present invention.

Referring to FIG. 5, the power-on reset circuit of the present invention includes a power supply voltage detection unit 100, a driving unit 200 and a sensing-node voltage level stabilizing unit 300.

A node NPOR_1 of FIG. 5 corresponds to the sensing node SN of FIGS. 3 and 4.

The power supply voltage detection unit 100 includes a pull-up device 120A for pulling up the node NPOR_3, a pull-down device 120B for pulling down the node NPOR_3 and a current sink unit 130 for sinking a current from the sensing node NPOR_1.

The pull-up device 120A includes: a plurality of diode-connected NMOS transistors NS1 and NS2 connected in series between a power supply voltage (VCC) terminal and the node NPOR_3; and a plurality of PMOS transistors PS1, PS2 and PS3 connected in series between the power supply (VCC) terminal and the node NPOR_3 and having a gate connected to the ground (VCC) terminal.

The pull-down device 120B includes: an NMOS transistor NM2 connected between the node NPOR_3 and the ground (VSS) terminal having a gate connected to the sensing node NPOR_1 in a feedback form. The pull-down device 120B pulls down the node NPOR_3 in response to a voltage level of the sensing node NPOR_1.

The pull-up device 120A and the pull-down device 120B constitute a current detection unit (in FIGS. 3 and 4, 120) and provide the pull-up current and the pull-down current, respectively.

The current sink unit 130 includes an NMOS transistor NM3 connected between the sensing node NPOR_1 and the ground (VSS) terminal and having a gate connected to the node NPOR_3.

Accordingly, the voltage level of the node NPOR_3 is determined by a ratio of the pull-up current to the pull-down current, in which the pull-up current flows in via the pull-up device 120A and the pull-down current flows out via the pull-down device 120B.

If the voltage level of the node NPOR_3 is larger than the threshold voltage, the current sink unit 130 sinks the current of the sensing node NPOR_1 so that the voltage level of the sensing node NPOR_1 is set to the ground voltage (the logic "0").

Preferably, the power supply voltage detection unit 140 further includes a load capacitor NMOR transistor 140 connected between the node NPOR_3 and the ground terminal. The load capacitor NMOS transistor 140 maintains the node NPOR_3 at a low level, so that the NMOS transistor NM3 is initially turned off.

The load capacitor NMOS transistor 140 of the power supply voltage detection unit 100 can be implemented with an NMOS transistor having a source/drain commonly connected to the node NPOR_3 and a gate connected to the ground terminal.

Further, the load capacitor NMOS transistor 140 of the power supply voltage detection unit 100 can be implemented with an NMOS transistor having a gate connected to the node NPOR_3 and a source/drain commonly connected to the ground terminal. Furthermore, the load capacitor NMOS transistor 140 can use the capacitor NMOS transistor of the above two structures.

The driving unit 200 includes a pull-up driving unit 220 for pulling up the sensing node NPOR_1 below the threshold voltage and a buffering unit 2302 for buffering a signal of the sensing node NPOR_1 and outputting the power-on reset signal RESET.

The pull-up driving unit 220 includes: a capacitor PMOS transistor 221 having a source/drain commonly connected to the power supply terminal and a gate connected to the sensing node NPOR_1; an inverter 222 having an input terminal connected to the sensing node NPOR_1; and a PMOS transistor 223 having a gate connected to an output terminal of the inverter 222 and a source/drain connected between the power supply terminal and the node NPOR_1.

The buffering unit 230 is implemented with an inverter having an input terminal connected to an output terminal of the inverter 222, and the buffering unit 230 outputs the power-on reset signal RESET.

The sensing-node voltage level stabilizing unit 300 includes: PMOS transistors PR1 and PR2 constituting an inverter latch 310, whose input terminal and output terminal are cross-connected to each other between the sensing node NPOR_1 and the sensing node NPOR_2; and an enable transistor unit 320 for enabling/disabling the inverter latch 310 according to the voltage level of the sensing node NPOR_1, in which the enable transistor unit 320 is provided with an NMOS transistor NM1 having a gate connected to the sensing node NPOR_1 and a source/drain connected between the inverter latch 310 and the ground terminal.

Preferably, the sensing-node voltage level stabilizing unit 300 further includes a load capacitor NMOS transistor unit 330 connected between the node NPOR_2 and the ground terminal. The load capacitor NMOS transistor unit 330 initially sets the node NPOR_2 to a stable "low" level.

As shown, the load capacitor NMOS transistor unit 330 includes: an NMOS transistor 332 having a source/drain commonly connected to the node NPOR_2 and a gate connected to the ground terminal; and an NMOS transistor 334 having a gate connected to the node NPOR_2 and a source/drain commonly connected to the ground terminal. Of course, either of the two capacitor NMOS transistors 332 and 334 can be used.

Hereinafter, an operation of the power-on reset circuit shown in FIG. 5 will be described in detail.

If the signal of the sensing node NPOR_1 is set to a high level, the latch enable transistor (i.e., the NMOS transistor NM1) is turned on, so that the sensing nodes NPOR_1 and NPOR_2 are set to a high level and a low level, respectively.

In addition, the NMOS transistor NM2 is turned on in response to the high level of the node NPOR_1 so that the node NPOR_3 is set to a low level. Since the node NPOR_3 is a low level, the NMOS transistor NM3 remains at a turned-off state.

Meanwhile, if he power supply voltage VCC is gradually increased, the current level flowing through the PMOS transistors PS1, PS2 and PS3 and the NMOS transistors NS1 and NS2 of the pull-up device 120A is increased.

Accordingly, the voltage level of the node NPOR_3 is determined by a ratio of the current flowing in via the pull-up device 120A to the current flowing out via the NMOS transistor NM2 of the pull-down device 120B.

If the voltage of the node NPOR_3 is larger than a predetermined level, the voltage level of the sensing node NPOR_1 is set to a low level by the NMOS transistor NM3.

Then, since the NMOS transistor NM1 of the sensing-node voltage level stabilizing unit 300 is set to a turned-off state, the node NPOR_2 is pulled up to a high level by the low level of the sensing node NPOR_1. Therefore, the pulling-up current is also cut in the sensing node NPOR_1.

Meanwhile, the NMOS transistor NM2 of the power supply voltage detection unit 100 is set to a turned-off state, so that the node NPOR_3 is pulled up to the power supply voltage (VCC) level by the PMOS transistors PS1, PS2 and PS3.

Accordingly, since the NMOS transistor NM3 maintains the turned-on state, the sensing node NPOR_1 is fixed to a low level.

Initially, the node NPOR_3 maintains a low level by the load capacitor NMOS transistor 140 so as to turn off the NMOS transistor NM3 at an earlier stage.

Figure 6:
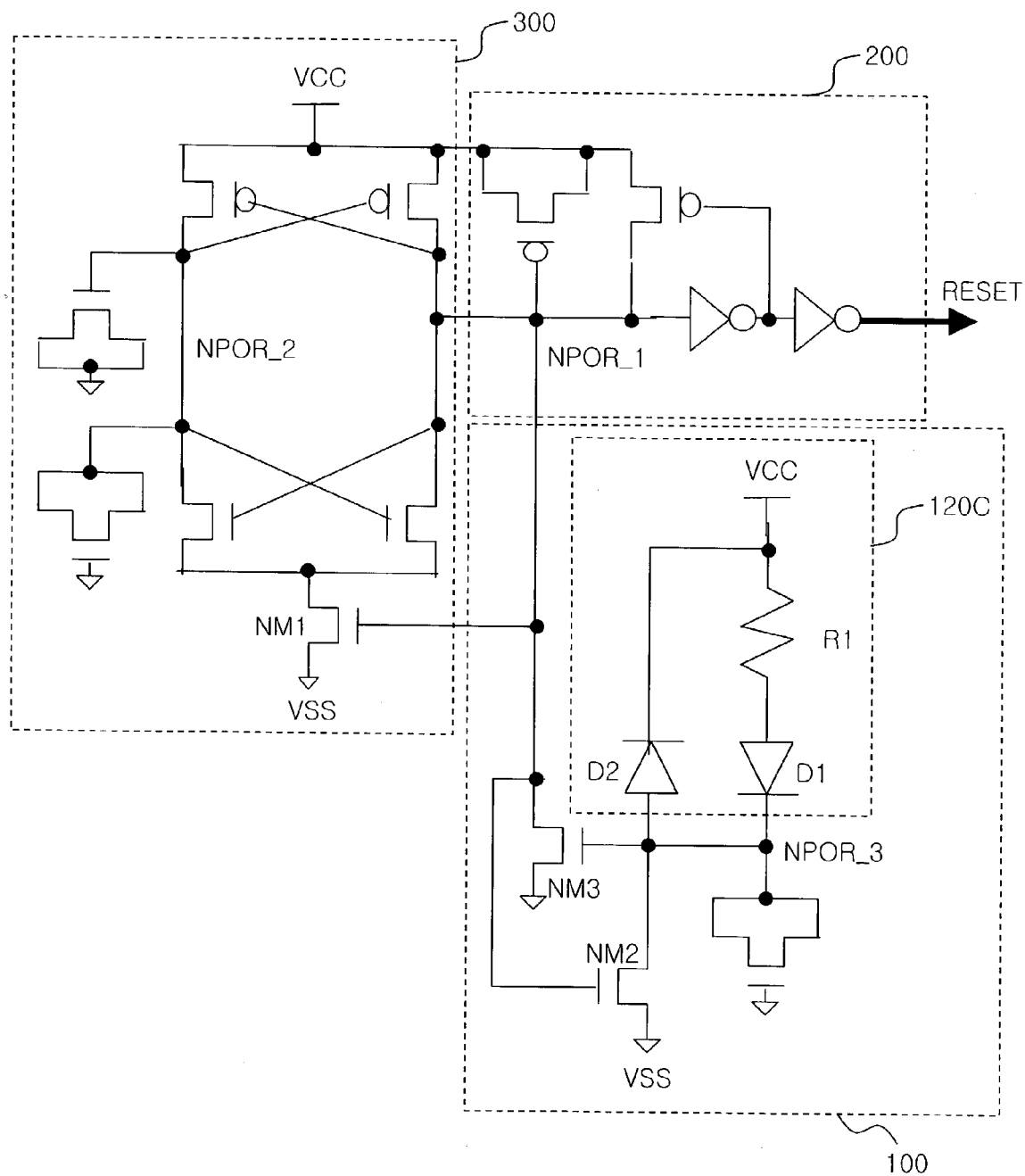
FIG. 6 is a circuit diagram of a power-on reset circuit in a second embodiment of the present invention.

FIG. 6 is a circuit diagram of a power-on reset circuit in another embodiment of the present invention.

Referring to FIG. 6, the power-on reset circuit of the present invention includes a power supply voltage detection unit 100, a driving unit 200 and a sensing-node voltage level stabilizing unit 300. Compared with FIG. 5, the pull-up device of the power supply voltage detection unit 100 is modified. The other configurations are the same as FIG. 5.

The pull-up device 120C includes: a resistor R1 having one terminal connected to the power supply terminal; a diode D1 having an input terminal connected to the other terminal of the resistor R1 and an output terminal connected to the node NPOR_3. The current does not almost flow in via the node NPOR_3 at a voltage lower than a threshold voltage of the diode.

The node NPOR_3 is pulled up to a high level at a voltage higher than a predetermined voltage. At this time, the resistor R1 prevents the node NPOR_3 from being suddenly pulled up.

In addition, the pull-up device 120C includes a diode D2 having an input terminal connected to the node NPOR_3 and an output terminal connected to the power supply terminal. The diode D2 is a device for rapidly setting the node NPOR_3 to a low level when the power supply voltage is down.

Figure 7:
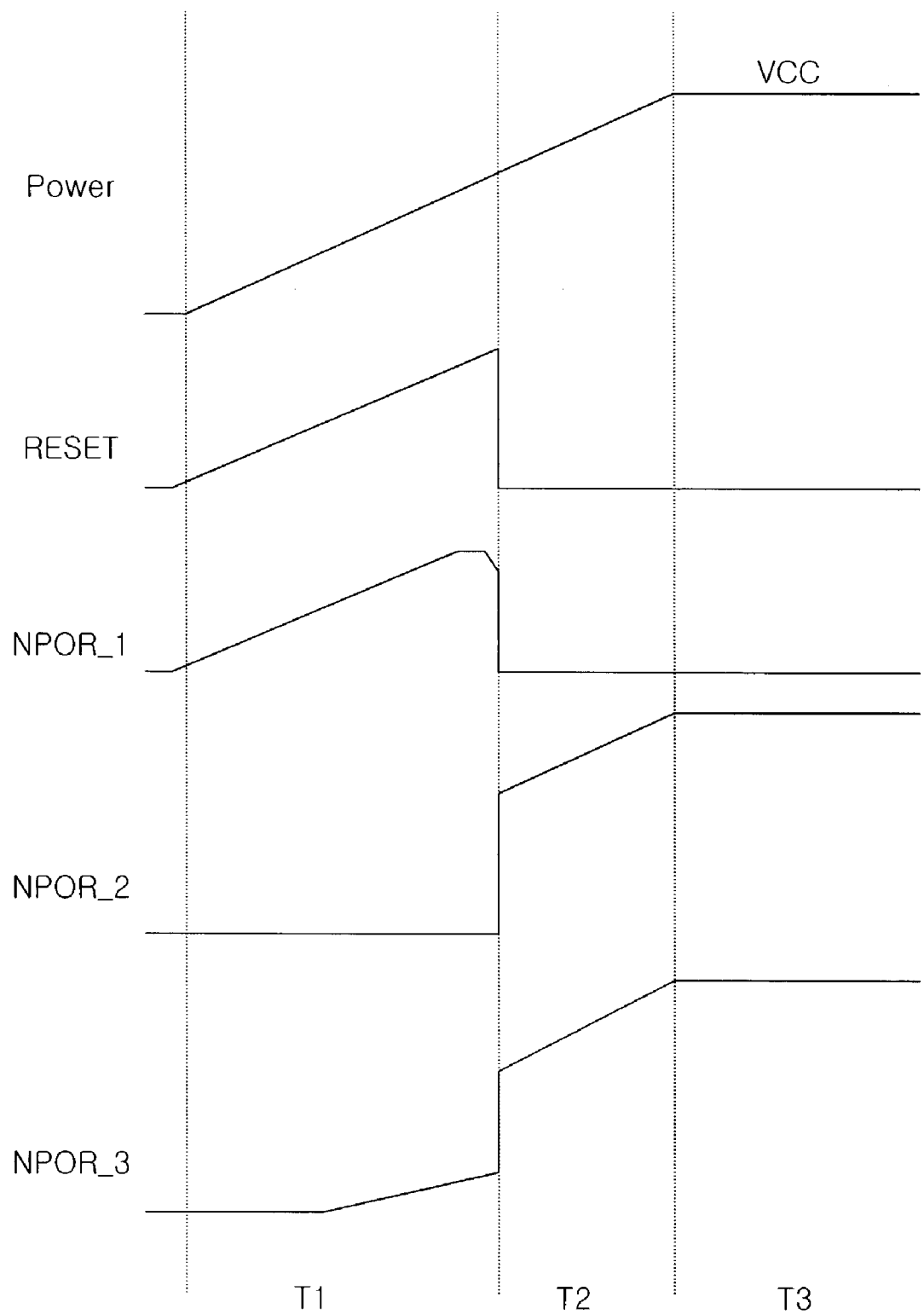
FIG. 7 is a timing diagram of the power-on reset circuits in accordance with the first and second embodiments of the present invention.

FIG. 7 is a timing diagram of the power-on reset circuits in accordance with the first and second embodiments of the present invention.

A period T1 is a sensing period of the power-on reset signal RESET and the power-on reset signal RESET is increased along the power supply voltage POWER. A period T2 is an active period of the power-on reset signal RESET. A period T3 is a period when the power-up operation is completed.

The power-on reset circuit in accordance with the present invention generates the power-on reset signal using not an RC delay method but a current detection method.

Accordingly, since the power-on reset signal can be generated regardless of the power-up slope, the semiconductor device driven in response to the power-on reset signal is driven at a voltage lower than a normal voltage, thereby preventing an occurrence of error.

Specifically, when the FeRAM code register operates at a voltage lower than the normal voltage, data stored in the FeRAM code register is incorrectly read or restored in an insufficient state, so that failure of the FeRAM code register is incurred. However, if the power-on reset circuit of the present invention is applied, this problem can be solved.

Further, in the power-up reset circuit of the present invention, since the power-on reset signal RESET is automatically reset to a latch state, it is possible to generating the power-on reset signal without any glitch near the active state (the logic "0").

While the present invention has been described with respect to certain preferred embodiments only, other modifications and variation may be made without departing from the spirit and scope of the present invention as set forth in the following claims.

What is claimed is:

1. A power-on reset circuit comprising:
a power supply voltage sensing node;
a power supply voltage detecting means for detecting a power supply voltage level caused by a difference between a pull-up current and a pull-down current and pulling down the power supply voltage sensing node if the power supply voltage level reaches a threshold voltage; and
a driving means connected to the power supply voltage sensing node, for pulling up the power supply voltage sensing node if the power supply voltage level is lower than the threshold voltage and buffering a signal of the power supply voltage sensing node to output a power-on reset signal.

2. The power-on reset circuit as recited in claim 1, wherein the power supply voltage detecting means includes:
a current detection unit for detecting the power supply voltage level caused by the difference between the pull-up current and the pull-down current, a voltage level of the power supply voltage sensing node feeding back to the current detection unit; and
a current sink means connected to the current detection unit, for sinking a current of the power supply voltage sensing node if the power supply voltage reaches the threshold voltage.

3. The power-on reset circuit as recited in claim 2, wherein the current detection unit includes:
a pull-up device connected between a power supply terminal and a node (NPOR_3), for pulling up the node (NPOR_3); and
a pull-down device for pulling down the node (NPOR_3) in response to the voltage level of the sensing node.

4. The power-on reset circuit as recited in claim 2, wherein the current sink means includes an NMOS transistor having a source/drain connected between the sensing node and a ground terminal and a gate connected to the node (NPOR_3).

5. The power-on reset circuit as recited in claim 3, wherein the pull-up device includes:
a plurality of diode-connected NMOS transistors connected in series between the power supply terminal and the node (NPOR_3); and
a plurality of PMOS transistors connected in series between the power supply terminal and the node (NPOR_3), gates of the PMOS transistors being commonly connected to the power supply terminal.

6. The power-on reset circuit as recited in claim 3, wherein the pull-up device includes:
a resistor having one terminal connected to the power supply terminal;
a first diode having an input terminal connected to the other terminal of the resistor and an output terminal connected to the node (NPOR_3); and
a second diode having an input terminal connected to the node (NPOR_3) and an output terminal connected to the power supply terminal.

7. The power-on reset circuit as recited in claim 3, wherein the pull-down device includes an NMOS transistor having a source/drain connected between the node (NPOR_3) and the ground terminal and a gate connected to the sensing node.

8. The power-on reset circuit as recited in claim 1, wherein the driving means includes:
a pull-up driving unit for pulling up the sensing node below the threshold voltage; and
a buffering unit for buffering the signal of the sensing node and outputting the power-on reset signal.

9. The power-on reset circuit as recited in claim 8, wherein the pull-up driving unit includes:
a capacitor-PMOS transistor having a source/drain commonly connected to the power supply terminal and a gate connected to the sensing node;
a first inverter receiving the voltage level of the sensing node; and a PMOS transistor having a gate connected to an output terminal of the first inverter and a source/drain connected between the power supply terminal and the sensing node.

10. The power-on reset circuit as recited in claim 9, wherein the buffering unit includes a second inverter having an input terminal connected to the output terminal of the first inverter and outputting the power-on reset signal.

11. The power-on reset circuit as recited in claim 2, wherein the power supply voltage detection unit further includes a load capacitor-transistor unit connected between the node (NPOR_3) and a ground terminal.

12. The power-on reset circuit as recited in claim 11, wherein the load capacitor-transistor unit includes an NMOS transistor having a source/drain commonly connected to the node (NPOR_3) and a gate connected to the ground terminal.

13. The power-on reset circuit as recited in claim 11, wherein the load capacitor-transistor unit includes an NMOS transistor having a gate connected to the node (NPOR_3) and a source/drain commonly connected to the ground terminal.

14. A power-on reset circuit comprising:
a power supply voltage sensing node;
a power supply voltage detecting means for detecting a power supply voltage level caused by a difference between a pull-up current and a pull-down current, and pulling down the power supply voltage sensing node if the power supply voltage level reaches a threshold voltage;
a driving means connected to the power supply voltage sensing node, for pulling up the power supply voltage sensing node if the power supply voltage level is lower than the threshold voltage and buffering a signal of the power supply voltage sensing node to output a power-on reset signal; and
a sensing-node voltage level stabilizing means connected to the sensing node, for latching the voltage level of the sensing node to thereby stabilize the voltage level thereof.

15. The power-on reset circuit as recited in claim 14, wherein the sensing-node voltage level stabilizing means includes:
an inverter latch having an input terminal and an output terminal cross-connected to each other between the sensing node and a node (NPOR_2); and
an enabling means for enabling the inverter latch in response to the voltage level of the sensing node.

16. The power-on reset circuit as recited in claim 15, wherein the enabling means includes an NMOS transistor having a gate connected to the sensing node and a source/drain connected between the inverter latch and a ground terminal.

17. The power-on reset circuit as recited in claim 15, wherein the sensing-node voltage level stabilizing means further includes a load capacitor-transistor unit connected between the node (NPOR_2) and a ground terminal.

18. The power-on reset circuit as recited in claim 17, wherein the load capacitor transistor unit includes an NMOS transistor having a source/drain commonly connected to the node (NPOR_2) and a gate connected to the ground terminal.

19. The power-on reset circuit as recited in claim 17, wherein the load capacitor-transistor unit includes an NMOS transistor having a gate connected to the node (NPOR_2) and a source/drain commonly connected to the ground terminal.

20. The power-on reset circuit as recited in claim 14, wherein the power supply voltage detecting means includes:
a current detection unit for detecting the power supply voltage level caused by the difference between the pull-up current and the pull-down current, a voltage level of the power supply voltage sensing node feeding back to the current detection unit; and
a current sink means connected to the current detection unit, for sinking a current of the power supply voltage sensing node if the power supply voltage reaches the threshold voltage.

21. The power-on reset circuit as recited in claim 20, wherein the current detection unit includes:
a pull-up device connected between a power supply terminal and a node (NPOR_3), for pulling up the node (NPOR_3); and
a pull-down device for pulling down the node (NPOR_3) in response to the voltage level of the sensing node.

22. The power-on reset circuit as recited in claim 20, wherein the current sink means includes an NMOS transistor having a source/drain connected between the sensing node and the ground terminal and a gate connected to the node (NPOR_3).

23. The power-on reset circuit as recited in claim 21, wherein the pull-up device includes:
a plurality of diode-connected NMOS transistors connected in series between the power supply terminal and the node (NPOR_3); and
a plurality of PMOS transistors connected in series between the power supply terminal and the node (NPOR_3), gates of the PMOS transistors being commonly connected to the ground terminal.

24. The power-on reset circuit as recited in claim 21, wherein the pull-up device includes:
a resistor having one terminal connected to the power supply terminal;
a first diode having an input terminal connected to the other terminal of the resistor and an output terminal connected to the node (NPOR_3); and
a second diode having an input terminal connected to the node (NPOR_3) and an output terminal connected to the power supply terminal.

25. The power-on reset circuit as recited in claim 21, wherein the pull-down device includes an NMOS transistor having a source/drain connected between the node (NPOR_3) and the ground terminal and a gate connected to the sensing node.

26. The power-on reset circuit as recited in claim 14, wherein the driving means includes:
a pull-up driving unit for pulling up the sensing node below the threshold voltage; and
a buffering unit for buffering the signal of the sensing node and outputting the power-on reset signal.

27. The power-on reset circuit as recited in claim 26, wherein the pull-up driving unit includes:
a capacitor-PMOS transistor having a source/drain commonly connected to the power supply terminal and a gate connected to the sensing node;
a first inverter receiving the voltage level of the sensing node; and
a PMOS transistor having a gate connected to an output terminal of the first inverter and a source/drain connected between the power supply terminal and the sensing node.

28. The power-on reset circuits recited in claim 27, wherein the buffering unit includes a second inverter having an input terminal connected to the output terminal of the first inverter and outputting the power-on reset signal.

29. The power-on reset circuit as recited in claim 20, wherein the power supply voltage detection unit further includes a load capacitor-transistor unit connected between the node (NPOR_3) and a ground terminal.

30. The power-on reset circuit as recited in claim 29, wherein the load capacitor-transistor unit includes an NMOS transistor having a source/drain commonly connected to the node (NPOR_3) and a gate connected to the ground terminal.

31. The power-on reset circuit as recited in claim 29, wherein the load capacitor-transistor unit includes an NMOS transistor having a gate connected to the node (NPOR_3) and a source/drain commonly connected to the ground terminal.

* * * * *